United States Patent

Matsumoto et al.

(10) Patent No.: US 10,234,493 B2
(45) Date of Patent: Mar. 19, 2019

(54) WIRELESS MODULE, ELECTRONIC MODULE, AND MEASURING METHOD

(71) Applicant: FUJITSU COMPONENT LIMITED, Tokyo (JP)

(72) Inventors: Hironobu Matsumoto, Tokyo (JP); Masahiro Yanagi, Tokyo (JP); Kimihiro Maruyama, Tokyo (JP); Tatsushi Shibuya, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 38 days.

(21) Appl. No.: 14/838,479

(22) Filed: Aug. 28, 2015

(65) Prior Publication Data

US 2016/0069943 A1 Mar. 10, 2016

(30) Foreign Application Priority Data

Sep. 4, 2014 (JP) .................................. 2014-180648

(51) Int. Cl.
| | |
|---|---|
| *G01R 29/10* | (2006.01) |
| *H01Q 21/00* | (2006.01) |
| *G01R 29/08* | (2006.01) |
| *H01Q 1/36* | (2006.01) |
| *H01Q 1/24* | (2006.01) |
| *H01Q 9/42* | (2006.01) |
| *H01Q 5/385* | (2015.01) |
| *G01R 31/28* | (2006.01) |

(52) U.S. Cl.
CPC ............ *G01R 29/10* (2013.01); *H01Q 1/243* (2013.01); *H01Q 5/385* (2015.01); *H01Q 9/42* (2013.01); *G01R 31/2822* (2013.01)

(58) Field of Classification Search
CPC .......... H01Q 1/243; H01Q 9/42; H01Q 5/385; G01R 29/0878; G01R 29/10
See application file for complete search history.

(56) References Cited

U.S. PATENT DOCUMENTS

| | | | | |
|---|---|---|---|---|
| 8,600,462 | B2 * | 12/2013 | Kato ..................... | H01Q 21/28 343/751 |
| 2007/0115178 | A1 * | 5/2007 | Chi ........................ | H01Q 1/243 343/700 MS |
| 2008/0030422 | A1 * | 2/2008 | Gevargiz ............. | H01Q 1/2216 343/860 |
| 2010/0156745 | A1 * | 6/2010 | Andrenko ................ | H01Q 1/38 343/848 |
| 2012/0064954 | A1 * | 3/2012 | Kato ..................... | H01Q 21/28 455/575.7 |
| 2013/0057452 | A1 * | 3/2013 | Watanabe .............. | H05K 1/114 343/905 |

FOREIGN PATENT DOCUMENTS

JP     2002-111379     4/2002

\* cited by examiner

*Primary Examiner* — Patrick Assouad
*Assistant Examiner* — Haidong Zhang
(74) *Attorney, Agent, or Firm* — IPUSA, PLLC

(57) ABSTRACT

A wireless module includes a substrate, an antenna provided on a surface of the substrate, and a circuit, provided on the substrate, and configured to transmit and receive signals through the antenna. The antenna includes a terminal provided on a tip end part thereof.

20 Claims, 18 Drawing Sheets

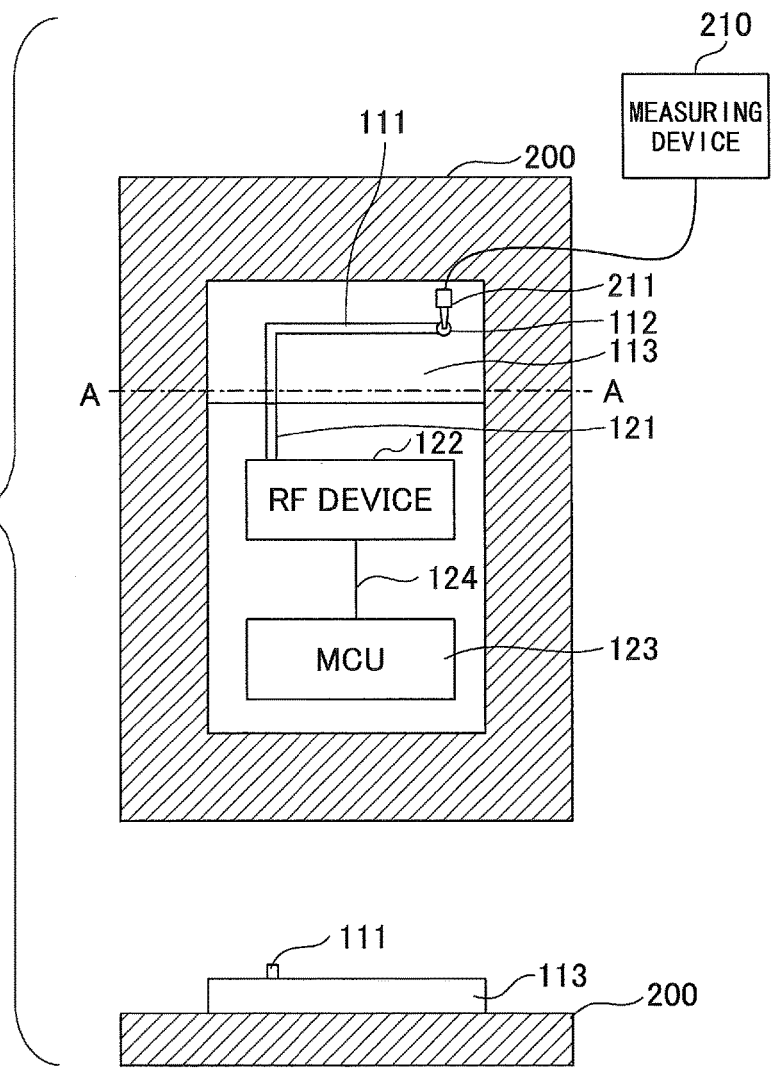

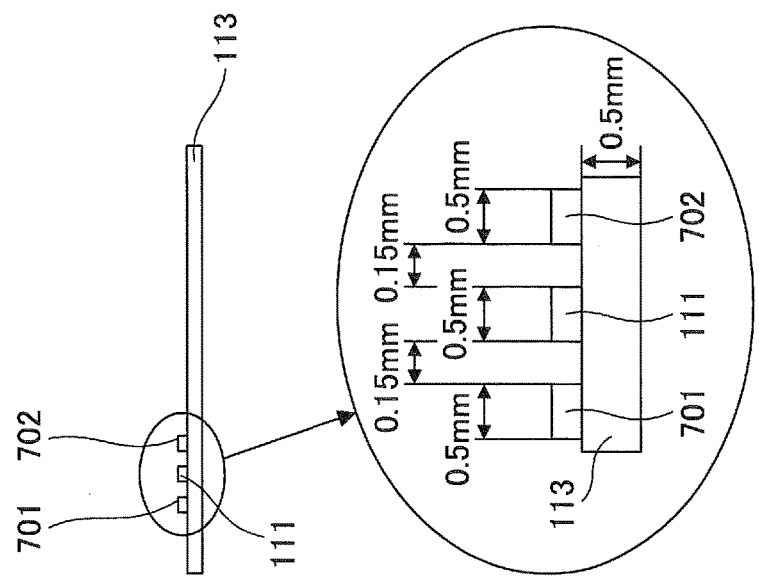
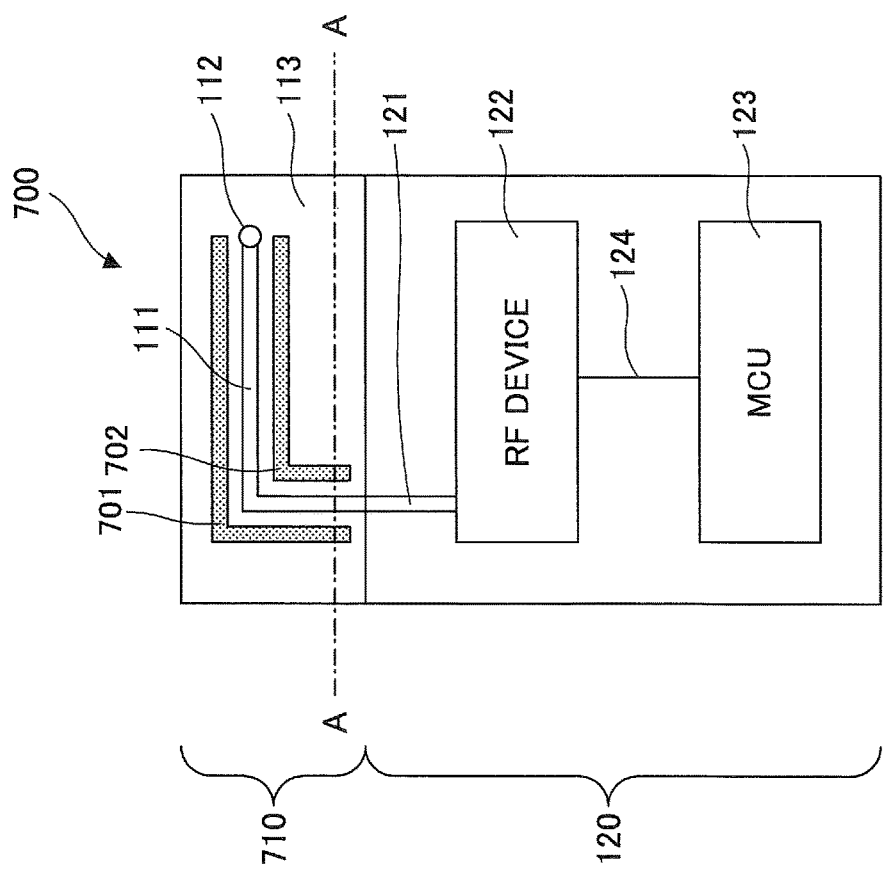

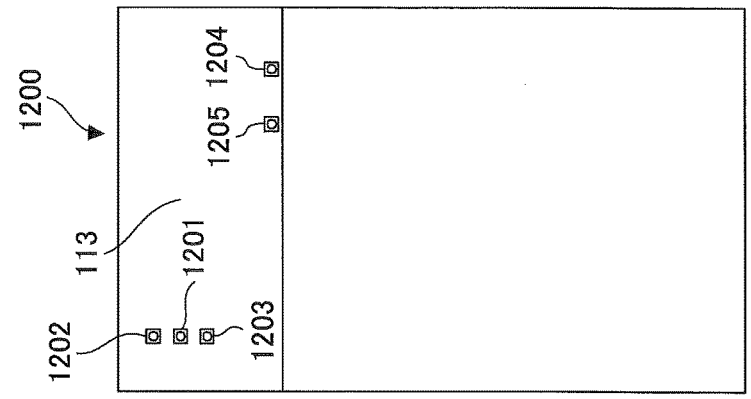
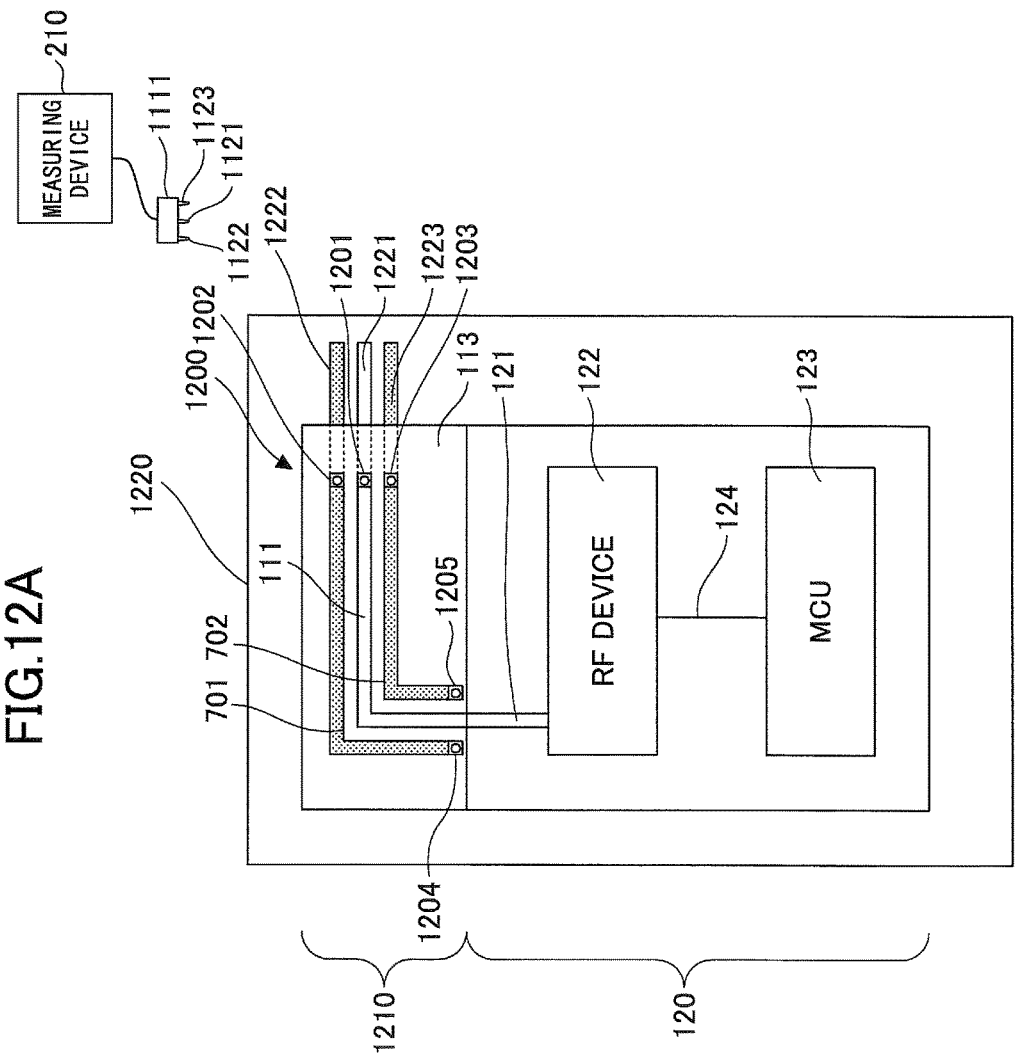

WIRELESS MODULE, ELECTRONIC MODULE, AND MEASURING METHOD

CROSS-REFERENCE TO RELATED APPLICATIONS

This application is based upon and claims the benefit of priority of Japanese Patent Application No. 2014-180648 filed on Sep. 4, 2014, the entire contents of which are incorporated herein by reference.

BACKGROUND OF THE INVENTION

1. Field of the Invention

The present invention relates to a wireless module, an electronic module, and a measuring method.

2. Description of the Related Art

Conventionally, an integrated-antenna type wireless module that is provided with a built-in antenna is known. In the integrated-antenna type wireless module, a connector having a switching function is provided between the antenna and a radio unit, for example, for use in measuring RF (Radio Frequency) characteristics. When measuring the RF characteristics, this connector is used by switching connection to a measuring device. In this case, the measuring device can measure the RF characteristics of the radio unit by disconnecting the antenna from the radio unit.

An example of an integrated-antenna type transmitter receiver is proposed in Japanese Laid-Open Patent Publication No. 2002-111379, for example.

However, in the case in which the connector having the switching function is provided in the wireless module, a cost of the wireless module increases. Further, space is required to provide the connector in the wireless module, and it is difficult to reduce the size of the wireless module.

SUMMARY OF THE INVENTION

Accordingly, it is an object in one aspect of the embodiments to provide a wireless module, an electronic module, and a measuring method which can reduce the cost and the size thereof.

According to one aspect of the embodiments, a wireless module includes a substrate; an antenna provided on a surface of the substrate; and a circuit, provided on the substrate, and configured to transmit and receive signals through the antenna, wherein the antenna includes a terminal provided on a tip end part thereof.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A, 2B, and 2C are diagrams for explaining a measuring method to measure RF characteristics of the wireless module;

FIGS. 7A and 7B are diagrams illustrating a configuration of the wireless module in a second embodiment;

FIGS. 12A and 12B are diagrams illustrating a configuration of the wireless module in a fifth embodiment;

DESCRIPTION OF EMBODIMENTS

Figure 1:
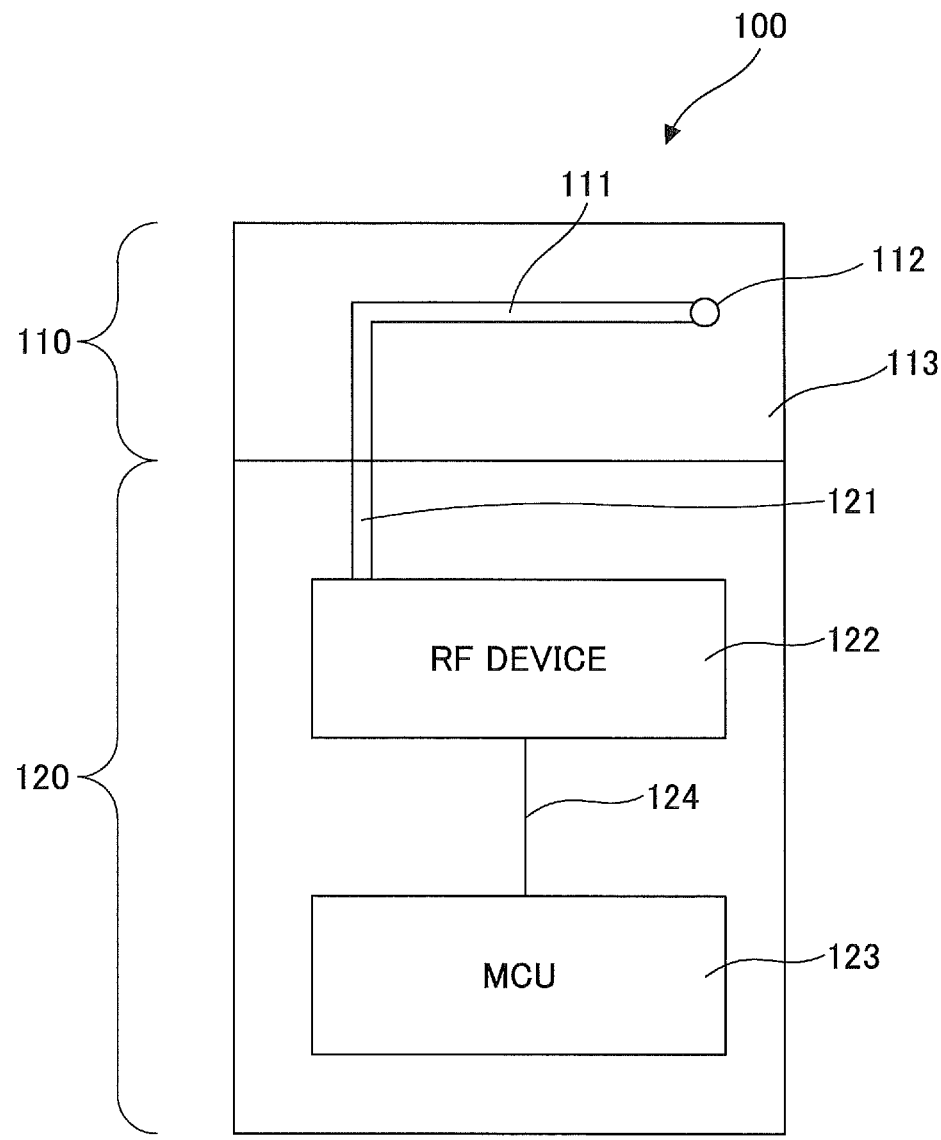
FIG. 1 is a diagram illustrating a configuration of a wireless module in a first embodiment.

As will be explained below, a wireless module in each of embodiments of the present invention can measure frequency characteristics, namely, the RF characteristics (or high-frequency characteristics) of the wireless module without providing a connector with a switching function. Hence, the cost and the size of the wireless module can be reduced.

In the case in which the connector having the switching function is not provided in the wireless module, a signal when measuring the RF characteristics is transmitted through a route identical to that used when using the wireless module (that is, when the wireless module makes a radio emission). For this reason, a signal loss is generated due to effects of radio emission from the antenna and effects of impedance mismatch, to thereby make it difficult to accurately measure the RF characteristics.

In view of the above, it is conceivable to provide a junction point between the radio unit and the antenna device, branch a line having a terminal on a tip end thereof from the junction point, and ground the antenna device to a ground plane when measuring the RF characteristics. In this case, when measuring the RF characteristics, an apparent disconnection of the antenna device from the junction point becomes possible. That is, when measuring the RF characteristics, the signal can be transmitted through a different route. However, in this case, a line having a predetermined length must branch from the junction point, and for this reason, it is difficult to reduce the size of the wireless module.

Accordingly, in each of the embodiments of the present invention, in order to measure the RF characteristics without providing the connector having the switching function in the wireless module, measures are taken so that when measuring the RF characteristics the signal is transmitted through a route identical to that used when using the wireless module and a signal loss is reduced at the same time. More particularly, the following measures m1 and m2 are taken, in addition to providing, on a tip end part of the antenna, a terminal to which a probe of a measuring device is electrically connected when measuring the RF characteristics.

m1: The wireless module is provided on a ground plane when measuring the RF characteristics, and the antenna is made to function as a transmission line (disabling the antenna function), in order to eliminate effects of radio emission from the antenna and reduce the signal loss; and m2: A characteristic impedance of the antenna in a state in which the wireless module is provided (or set) on the ground plane is determined to a predetermined value, in order to eliminate effects of impedance mismatch and reduce the signal loss. The predetermined value is equal to a value of a characteristic impedance of the transmission line to the antenna, and a value of a characteristic impedance of the measuring device.

As a result, according to each of the embodiments of the present invention, it is possible to accurately measure the RF characteristics, and to reduce both the cost and the size of the wireless module.

Embodiments of the present invention will be described with reference to the accompanying drawings. In the drawings, those parts that are substantially the same are designated by the same reference numerals, and a description of the parts that are substantially the same will not be repeated.

First Embodiment

<1. General Configuration of Wireless Module>

First, a description will be given of a configuration of the wireless module in a first embodiment. FIG. 1 is a diagram illustrating the configuration of a wireless module 100 in a first embodiment. As illustrated in FIG. 1, the wireless module 100 in this embodiment is an integrated-antenna type that includes an antenna device 110 and a radio device 120.

The antenna device 110 includes a pattern antenna 111, formed on a substrate 113, and configured to emit and receive radio waves. A terminal 112 is provided on a tip end part of the pattern antenna 111. The tip end part of the pattern antenna 111 may be a tip end position or a vicinity of the tip end position of the pattern antenna 111. As will be described later, a probe of a measuring device that measures the RF characteristics is electrically connected to the terminal 112. In the antenna device 110, a resist layer is formed over the pattern antenna 111, and the terminal 112 may be formed by removing the resist layer at the tip end part of the pattern antenna 111, for example.

The radio device 120 includes a transmission line 121, an RF device 122, an MCU (Micro Control Unit) 123, and a wiring 124. The transmission line 121 transmits a signal output from the RF device 122 to the pattern antenna 111. The RF device 122 may be a circuit that transmits the signal to the pattern antenna 111 to be emitted from the pattern antenna 111 as the radio waves, and receives the radio waves received by the pattern antenna 111, as the signal received through the transmission line 121, based on an instruction from the MCU 123. The MCU 123 is electrically connected to the RF device 122 via the wiring 124. The MCU 123 may be a microcontroller or circuit that controls the signal transmission and reception of the RF device 122, and modulates the signal output to the RF device 122 and demodulates the signal input to the RF device 122. The MCU 123 may provide an interface for enabling communication between the wireless module 100 and an external device (not illustrated). The transmission line 121, the RF device 122, the MCU 123, and the wiring 124 may be formed on the substrate 113.

<2. Method of Measuring RF Characteristics of Wireless Module>

Figure 2B:
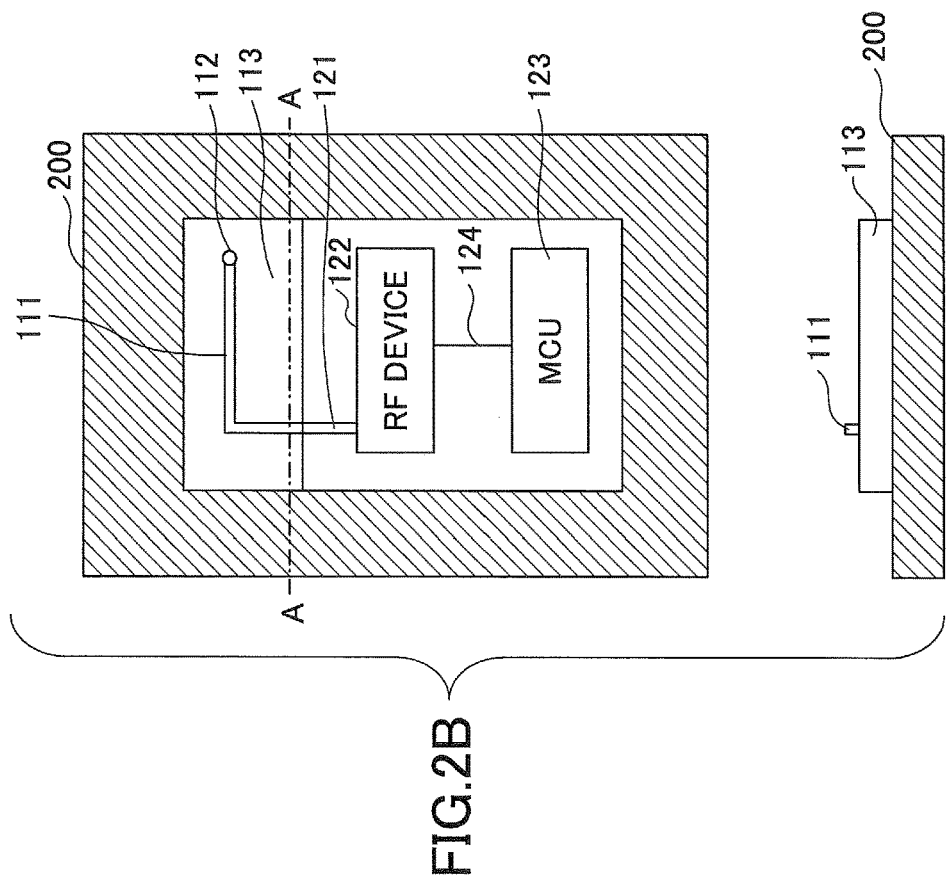
Figure 2A:
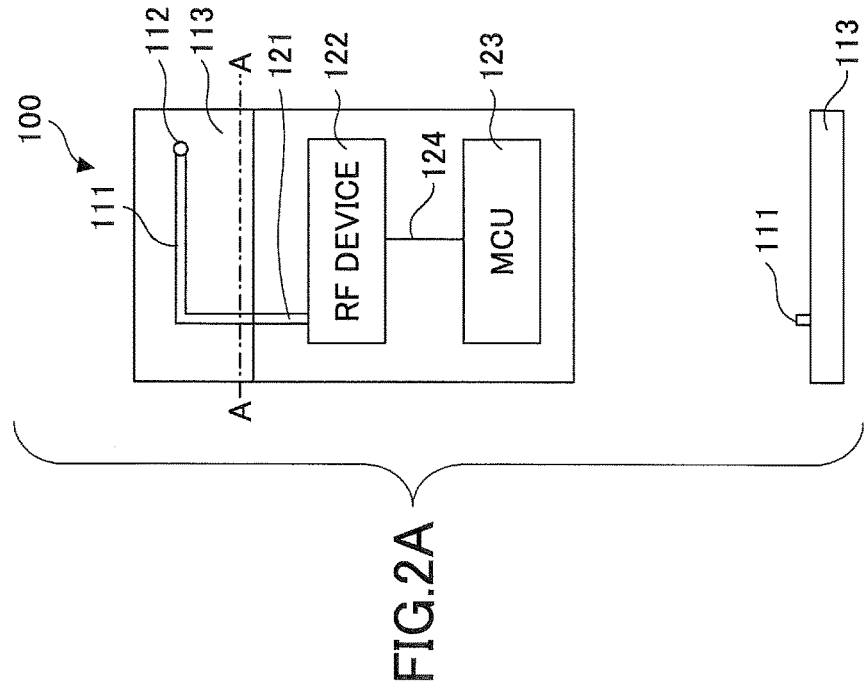

Next, a description will be given of a method to measure the RF characteristics of the wireless module 100. FIGS. 2A, 2B, and 2C are diagrams for explaining the method to measure the RF characteristics of the wireless module 100.

An upper part of FIG. 2A illustrates a plan view of the wireless module 100, and a lower part of FIG. 2A illustrates a cross sectional view of the antenna device 110 of the wireless module 100 along a line A-A in FIG. 2A. An upper part of each of FIGS. 2B and 2C similarly illustrates a plan view of the wireless module 100, and a lower part of each of FIGS. 2B and 2C similarly illustrates a cross sectional view of the antenna device 110.

In the wireless module 100 illustrated in FIG. 2A, the ground plane is eliminated from a periphery of the antenna device 110, in order to obtain a satisfactory emission characteristic of the pattern antenna 111.

On the other hand, when measuring the RF characteristics of the wireless module 100, the wireless module 100 is provided on a ground plane 200 formed by a metal plate or the like, as illustrated in FIG. 2B. By providing the ground plane 200 on a bottom surface of the wireless module 100, the antenna device 110 can form a microstrip transmission line as illustrated in FIG. 2B. Accordingly, the antenna function of the pattern antenna 111 is disabled.

Further, in the wireless module 100 illustrated in FIG. 2B, the antenna device 110 is formed so that a characteristic impedance of the pattern antenna 111 in the state in which the wireless module 100 is provided on the ground plane 200 becomes 50 [$\Omega$], for example. In other words, the antenna device 110 is formed, as will be described later, so that a characteristic impedance of the pattern antenna 111 in the state in which the ground plane 200 is provided on the bottom surface of the wireless module 100 becomes the same as a characteristic impedance of the transmission line 121 and a characteristic impedance of the measuring device 210.

Next, in the state of FIG. 2B, a probe 211 of the measuring device 210 is electrically connected to the terminal 112 of the pattern antenna 111 as illustrated in the upper part of FIG. 2C, in order to measure the RF characteristics of the wireless module 100.

In other words, in the state in which the RF characteristics of the wireless module 100 are measured,
 (i) the antenna device 110 forms the microstrip transmission line, and the antenna function of the pattern antenna 111 is disabled; and
 (ii) an impedance matching is achieved between the transmission line 121 and the pattern antenna 111, and also between the pattern antenna 111 and the measuring device 210.

For this reason, the signal output from the RF device 122
 (iii) is not emitted from the pattern antenna 111 as the radio waves; and
 (iv) is input to the probe 211 in a state in which an amount of reflection is minimized when the signal is input to the pattern antenna 111, and an amount of reflection is minimized when the signal is input to the measuring device 210.

Consequently, the undesirable effects of the radio wave emission from the pattern antenna 111 and the undesirable effects of the impedance mismatch are eliminated, and the RF characteristics can be measured at the tip end position of the pattern antenna 111 in a state in which the signal loss is reduced.

In the example illustrated in FIGS. 2A through 2C, the ground plane 200 is provided on the bottom surface of the wireless module 100 (or substrate 113) when measuring the RF characteristics of the wireless module 100, however, the ground plane 200 may be provided on a top surface of the wireless module 100 (or substrate 113), for example. Alternatively, when measuring the RF characteristics of the wireless module 100, the ground plane 200 is provided on both the bottom surface and the top surface of the wireless module 100. In a state in which the ground plane 200 may be provided on both the bottom surface and the top surface of the wireless module 100, the antenna device 110 forms the microstrip transmission line, and it is possible to obtain the effects of disabling the antenna function and achieving the impedance matching, similarly to the example illustrated in FIGS. 2A through 2C.

<3. Disabling Antenna Function of Pattern Antenna>

Next, a description will be given of the disabling of the antenna function of the pattern antenna 111. As described above, by providing the wireless module 100 on the ground plane 200, the antenna device 110 functions as the microstrip transmission line, and the antenna function of the pattern antenna 111 is disabled. The antenna device 110 may form the microstrip transmission line by making a width of the pattern antenna 111 and a thickness of the substrate 113 sufficiently small with respect to a wavelength of the signal output from the RF device 122.

By disabling the antenna function, the signal transmitted through the transmission line 121 is not emitted as the radio waves from the pattern antenna 111, and is absorbed by the measuring device 210. As a result, the measuring device 210 can measure the RF characteristics of the wireless module 100 without being affected by the radio wave emission from the pattern antenna 111.

Figure 3A:
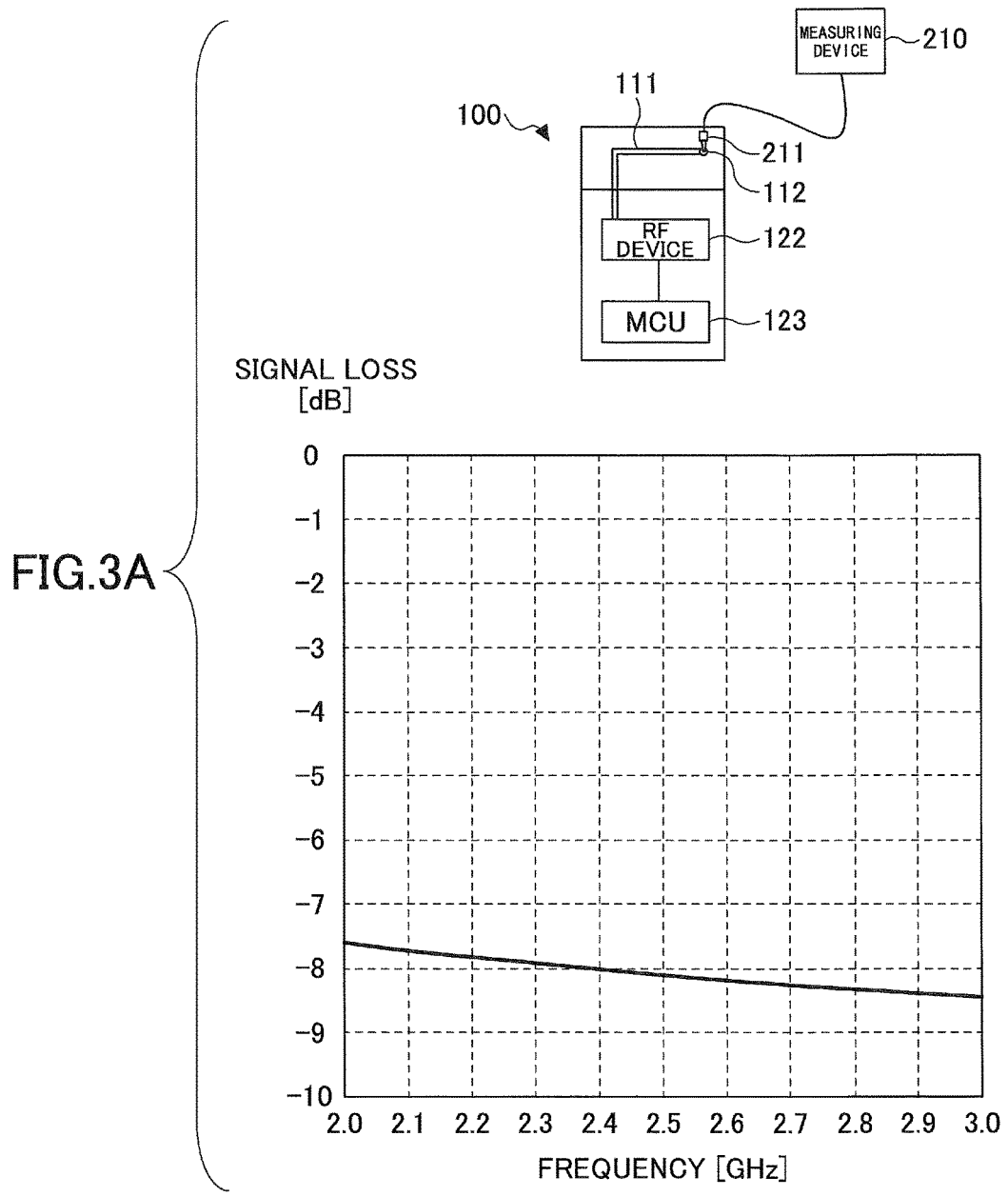
FIGS. 3A and 3B are diagrams for explaining effects of disabling an antenna function of a pattern antenna.
Figure 3B:
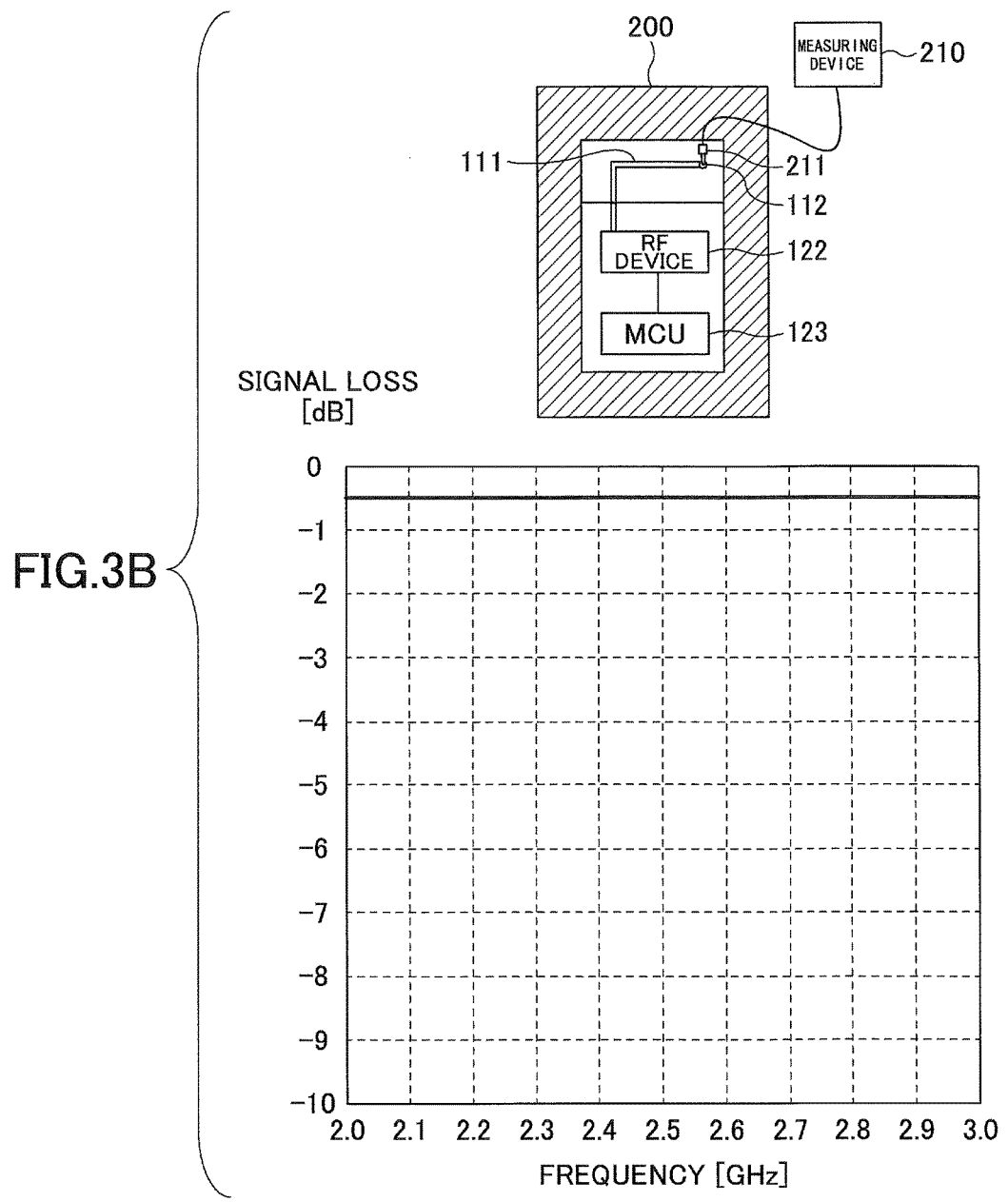

FIGS. 3A and 3B are diagrams for explaining the effects of disabling the antenna function of the pattern antenna 111. In each of FIGS. 3A and 3B, an upper part illustrates an arrangement that is used to measure the RF characteristics of the wireless module 100 at the terminal 112 on the tip end of the pattern antenna 111, and a lower part illustrates the signal loss of the RF characteristics measured. FIG. 3A illustrates a case in which the RF characteristics are measured by the measuring device 210 without providing the ground plane 200. On the other hand, FIG. 3B illustrates a case in which the RF characteristics are measured by the measuring device 210 by providing the wireless module 100 on the ground plane 200.

As illustrated in FIG. 3A, when the wireless module 100 is not provided on the ground plane 200, a signal loss of approximately −7.6 [dB] occurs with respect to a signal having a frequency of 2.0 [GHz]. In addition, the signal loss becomes larger as the frequency becomes higher.

On the other hand, as illustrated in FIG. 3B, when the wireless module 100 is provided on the ground plane 200, the signal loss can be suppressed to approximately −0.5 [dB] with respect to the signal having the frequency of 2.0 [GHz]. Moreover, the signal loss becomes approximately constant regardless of the frequency of the signal.

<4. Impedance Matching of Pattern Antenna>

Figure 4:
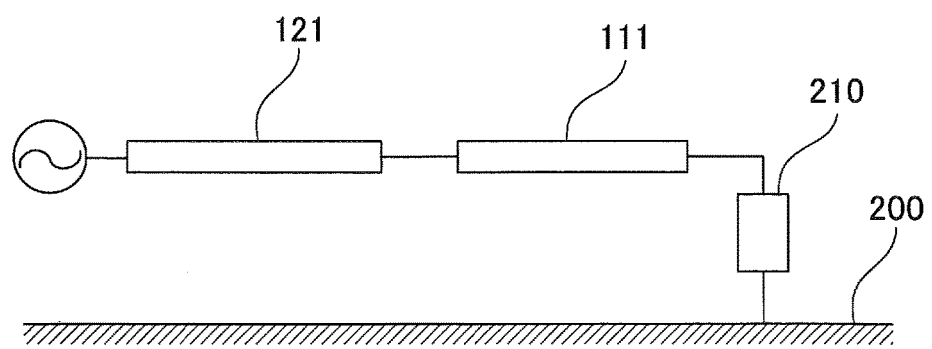
FIG. 4 is a diagram schematically illustrating a relationship of a transmission line, the pattern antenna, and a measuring device.

Next, a description will be given of the impedance matching of the pattern antenna 111. FIG. 4 is a diagram schematically illustrating a relationship of the transmission line 121, the pattern antenna 111, and the measuring device 210 at the time of measuring the RF characteristics.

As illustrated in FIG. 4, when the characteristic impedance of the transmission line 121 is the same as the characteristic impedance of the pattern antenna 111 in the state in which the wireless module 100 is provided on the ground plane 200, no signal reflection occurs between the transmission line 121 and the pattern antenna 111. In addition, when the characteristic impedance (or resistance load) of the measuring device 210 is the same as the characteristic impedance of the pattern antenna 111, no signal reflection occurs between the pattern antenna 111 and the measuring device 210.

Accordingly, the antenna device 110 of the wireless module 100 is configured so that, in the state in which the wireless module 100 is provided on the ground plane 200, the characteristic impedance of the antenna device 110 becomes the same as the characteristic impedance of the transmission line 121 and the characteristic impedance of the measuring device 210. As a result, the signal transmitted from the wireless module 100 is absorbed by the resistance load of the measuring device 210 in a state in which the signal loss caused by the impedance mismatch is suppressed.

Figures 5A, 5B:
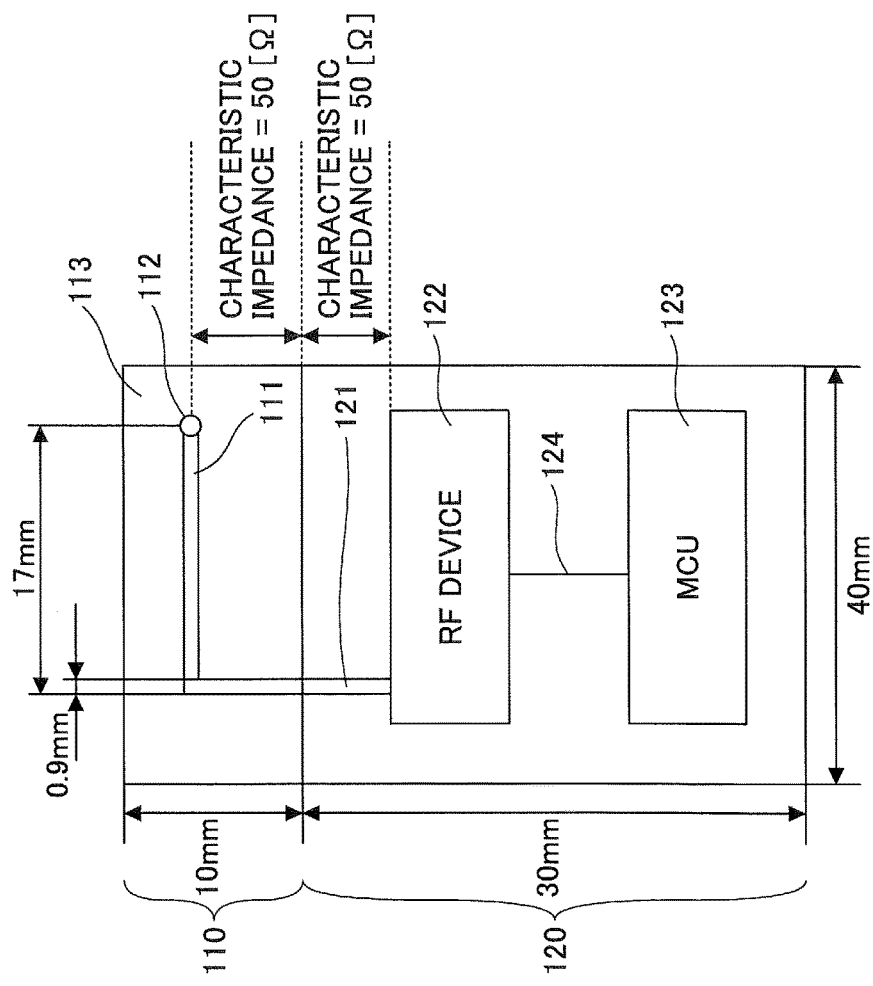
FIGS. 5A and 5B are diagrams for explaining a configuration of an antenna device for achieving impedance matching.

FIGS. 5A and 5B are diagrams for explaining the configuration of the antenna device 110 for achieving the impedance matching. FIG. 5A illustrates a plan view of the wireless module 100, and FIG. 5B illustrates a side view of the wireless module 100.

In FIGS. 5A and 5B, the characteristic impedance of the antenna device 110 in the state in which the wireless module 100 is provided on the ground plane 200 is determined to be the same as the characteristic impedance of the transmission line 121 and the characteristic impedance of the measuring device 210. The characteristic impedance of the antenna device 110 in the state in which the wireless module 100 is provided on the ground plane 200 may be derived from a thickness of the substrate 113, a dielectric constant of the substrate 113, and a width and thickness of the pattern antenna 111. In the example of the antenna device 110 illustrated in FIGS. 5A and 5B, the thickness of the substrate 113 is 0.5 [mm], the dielectric constant of the substrate 113 is 4.7 [F/m], the width of the pattern antenna 111 is 0.9 [mm], and the thickness of the pattern antenna 111 is 35 [μm].

In the example illustrated in FIG. 5A, the dimensions of the antenna device 110 of the wireless module 100 include a vertical length of 30 [mm] and a horizontal length of 40 [mm]. In addition, dimensions of the radio device 120 include a vertical length of 30 [mm] and a horizontal length of 40 [mm].

Figure 6:
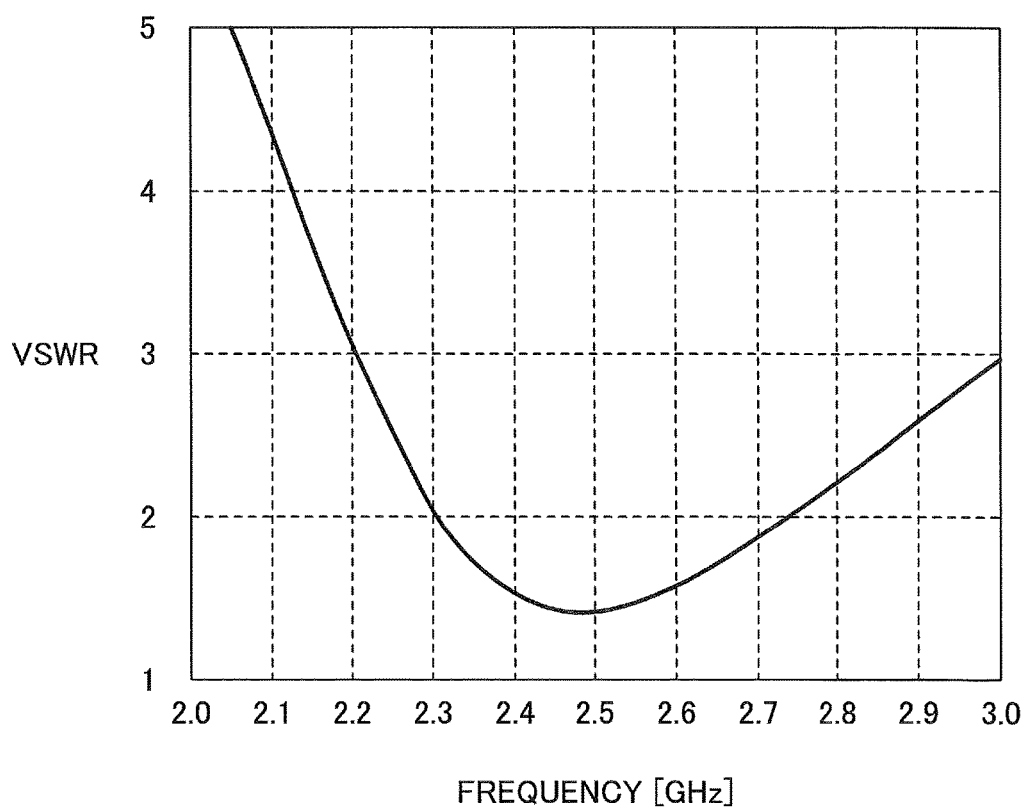
FIG. 6 is a diagram for explaining effects of the impedance matching.

Next, a description will be given of the effects of the impedance matching. FIG. 6 is a diagram for explaining the effects of the impedance matching. In FIG. 6, the abscissa indicates the frequency [GHz], and the ordinate indicates a VSWR (Voltage Standing Wave Ratio).

As illustrated in FIG. 6, by configuring the antenna device 110 to have the characteristic impedance of 50 [Ω], the VSWR can be suppressed to approximately 1.5 in a frequency band (or resonance frequencies) of 2.5 [GHz] to 2.5 [GHz].

<5. Summary>

As described above, the terminal 112 for use in measuring the RF characteristics of the wireless module 100 is provided on the tip end part of the pattern antenna 111. In addition, the antenna device 110 is configured so that the pattern antenna 111 forms the transmission line having the predetermined characteristic impedance, in the state in which the wireless module 100 is provided on the ground plane 200 and the probe 211 of the measuring device 210 is electrically connected to the terminal 112, in order to measure the RF characteristics.

Accordingly, the signal loss at the antenna device 110 of the wireless module 100 can be reduced, without having to provide the connector having the switching function in the wireless module 100. Hence, it is unnecessary to provide a space within the wireless module 100 for accommodating the connector. As a result, both the cost and the size of the wireless module 100 can be reduced, and it is possible to accurately measure the RF characteristics of the wireless module 100.

Second Embodiment

Next, a description will be given of the wireless module in a second embodiment, in which passive elements are arranged along the pattern antenna to form coplanar lines in the antenna device.

<1. General Configuration of Wireless Module>

FIGS. 7A and 7B are diagrams illustrating a configuration of the wireless module in a second embodiment. FIG. 7A illustrates a plan view of a wireless module 700, and FIG. 7B illustrates a cross sectional view of the wireless module 700 along a line A-A in FIG. 7A, together with a partially enlarged view. In FIG. 7B, a part surrounded by an oval is illustrated on an enlarged scale below. Parts of the wireless module 700 that are substantially the same as those corresponding parts of the wireless module 100 described in the first embodiment are designated by the same reference numerals, and a description thereof will be omitted.

As illustrated in FIG. 7A, passive elements 701 and 702 are provided on the substrate 113 of an antenna device 710. The passive elements 701 and 702 are arranged along both sides of the pattern antenna 111.

As illustrated in FIG. 7B, the passive elements 701 and 702 in this embodiment have a width of 0.5 [mm], and a spacing between the pattern antenna 111 and each of the passive elements 701 and 702 is 0.15 [mm].

<2. Effects of Coplanar Line>

Next, a description will be given of effects of arranging the passive elements 701 and 702 as illustrated in FIGS. 7A and 7B and forming coplanar lines in the antenna device 710, by referring to FIG. 8.

Figure 8:
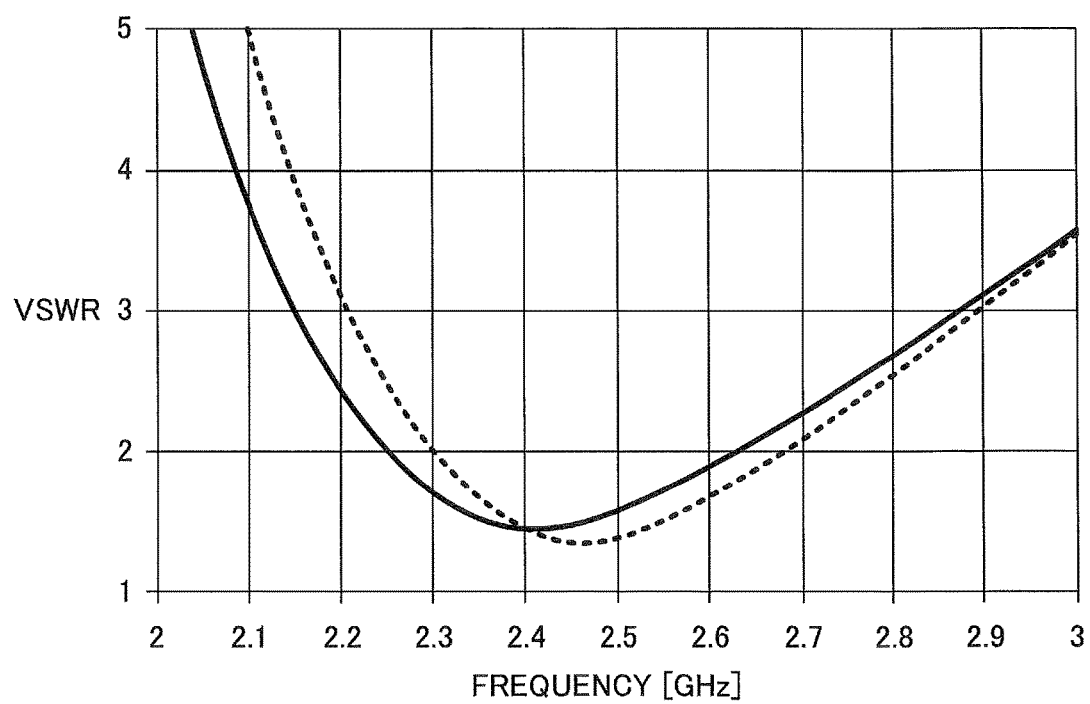
FIG. 8 is a diagram for explaining effects of a case in which coplanar lines are formed in the antenna device.

FIG. 8 is a diagram for explaining effects of a case in which the coplanar lines are formed in the antenna device 710. In FIG. 8, the abscissa indicates the frequency [GHz], and the ordinate indicates the VSWR. In addition, a dotted line in FIG. 8 indicates the VSWR in an initial state in which no passive elements 701 and 702 are provided, and a solid line in FIG. 8 indicates the VSWR in the state in which the passive elements 701 and 702 are provided.

As illustrated in FIG. 8, regardless of whether the passive elements 701 and 702 are provided, the impedance matching is achieved, and thus, the VSWR is suppressed to approximately 1.5.

On the other hand, in the case in which no passive elements 701 and 702 are provided, the VSWR in FIG. 8 becomes a minimum in a frequency band of 2.4 [GHz] to 2.5 [GHz], as indicated by the dotted line. In other words, the resonance frequency in this case becomes 2.4 [GHz] to 2.5 [GHz]. On the other hand, in the case in which the passive elements 701 and 702 are provided, the VSWR in FIG. 8 becomes a minimum in a frequency band of 2.35 [GHz] to 2.45 [GHz], as indicated by the solid line. In other words, the resonance frequency in this case becomes 2.35 [GHz] to 2.45 [GHz].

Accordingly, by providing the passive elements 701 and 702 and forming the coplanar lines in the antenna device 710, it is possible to shift the resonance frequency towards a low-frequency side. The length of the pattern antenna 111 may be shortened in order to shift the resonance frequency of the antenna using the coplanar lines illustrated in FIGS. 7A and 7B towards a high-frequency side.

In other words, when the coplanar lines are formed in the antenna device 710, the length of the pattern antenna 111 is shortened in order to obtain the same resonance frequency as the antenna device in which no coplanar lines are formed. Hence, in order to obtain the same resonance frequency, the size of the wireless module 700 in which the coplanar lines are formed can be reduced compared to the size of the wireless module 100 in which no coplanar lines are formed.

Even if the coplanar lines are formed in the antenna device 710, the wireless module 700 may be provided on the ground plane 200, similarly as in the case of the first embodiment described above, when measuring the RF characteristics of the wireless module 700. In this case, the antenna function of the pattern antenna 111 is disabled, similarly as in the case of the first embodiment described above. When the RF characteristics are measured through the terminal 112 at the tip end part of the pattern antenna 111, the measuring device 210 can measure the RF characteristics without being affected by the radio wave emission from the pattern antenna 111.

Figure 9:
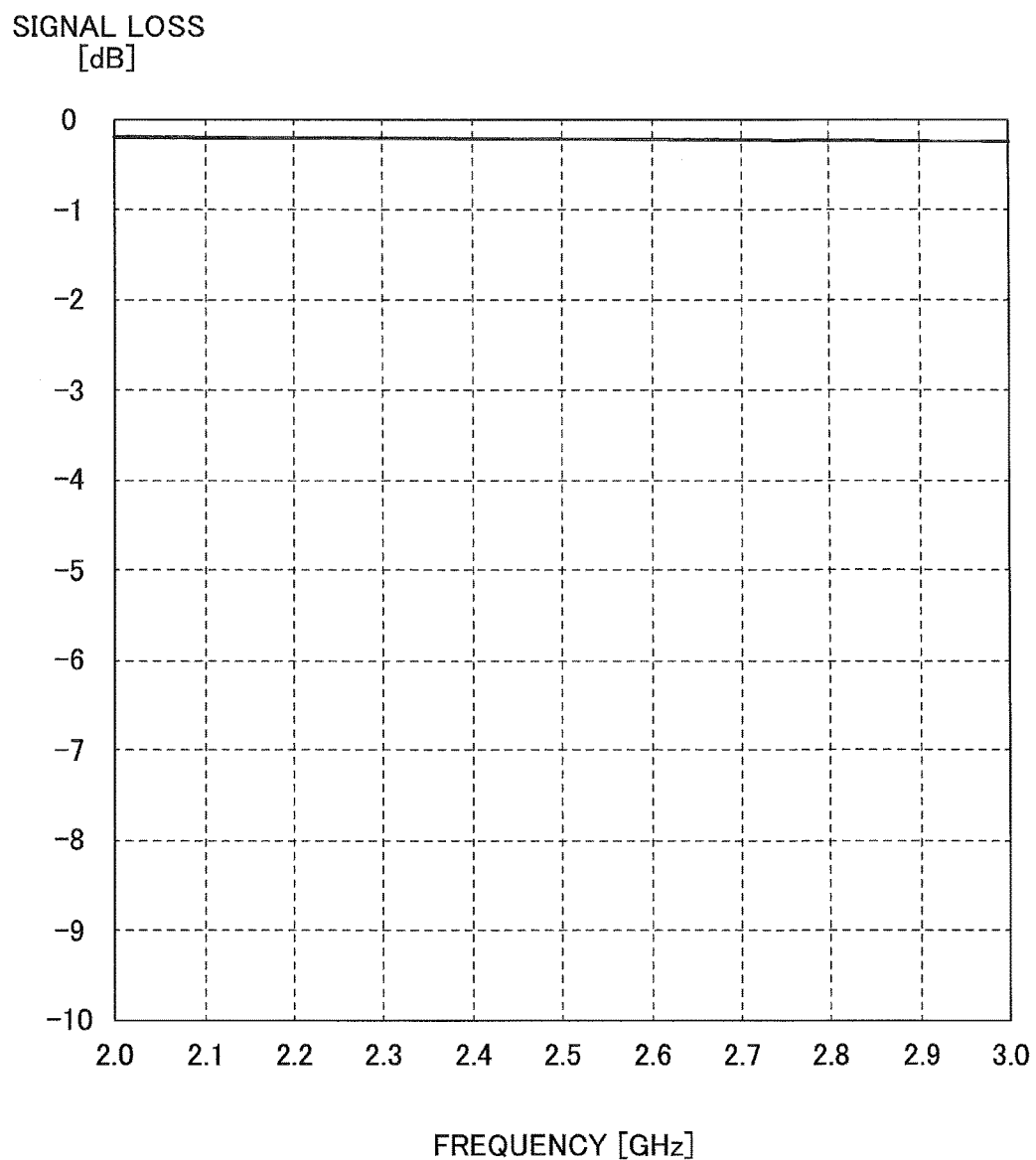
FIG. 9 is a diagram for explaining effects of disabling the antenna function of the pattern antenna.

FIG. 9 is a diagram for explaining effects of disabling the antenna function of the pattern antenna 111 of the wireless module 700. As illustrated in FIG. 9, the signal loss can be suppressed to approximately −0.3 [dB] with respect to the signal having the frequency of 2.0 [GHz], similarly as in the case of the first embodiment illustrated in FIG. 4B. In addition, the signal loss in FIG. 9 becomes approximately constant, regardless of the frequency of the signal.

Accordingly, in the case in which the coplanar lines are formed in the antenna device 710, effects similar to those obtainable in the first embodiment can be obtained. Further, the size of the wireless module 700 can further be reduced compared to the wireless module 100 in the first embodiment.

Third Embodiment

Figure 10A:
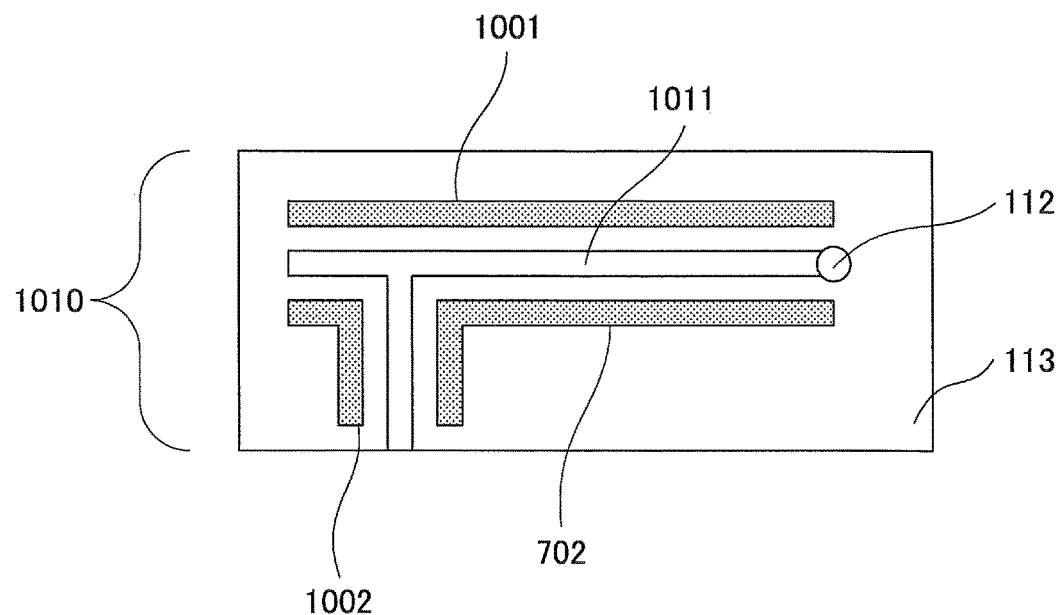
FIGS. 10A and 10B are diagrams illustrating configurations of the antenna device of the wireless module in a third embodiment.
Figure 10B:
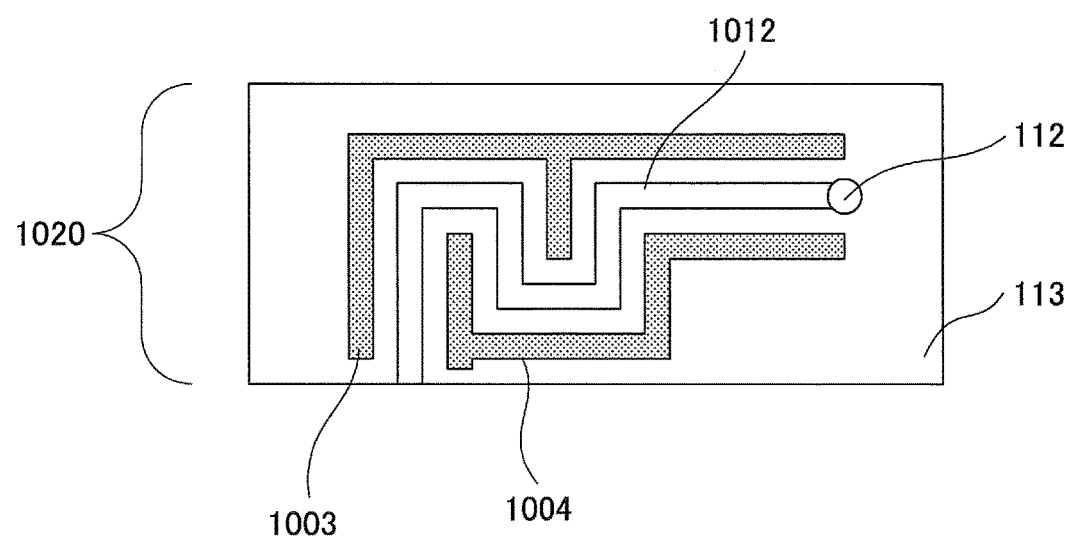

In the second embodiment described above, the pattern antenna 111 has an inverted L-shape. However, the shape of the pattern antenna 111 is not limited to the inverted L-shape. FIGS. 10A and 10B are diagrams illustrating configurations of the antenna device of the wireless module in a third embodiment. FIGS. 10A and 10B illustrate examples in which the pattern antenna of the antenna device has a shape other than the inverted L-shape, passive elements are arranged along both sides of the pattern antenna, and coplanar lines are formed in the antenna device.

FIG. 10A illustrates an antenna device 1010 in which a pattern antenna 1011 has an approximate T-shape, passive elements 702, 1001, and 1002 are arranged along both sides of the pattern antenna 1011, and the coplanar lines are formed in the antenna device 1010. On the other hand, FIG. 10B illustrates an antenna device 1020 in which a pattern antenna 1012 has an approximate meander-shape, passive elements 1003 and 1004 are arranged along both sides of the pattern antenna 1012, and the coplanar lines are formed in the antenna device 1020. In each of the examples illustrated in FIGS. 10A and 10B, it is possible to obtain effects similar to those obtainable in the second embodiment described above.

Fourth Embodiment

In the second embodiment described above, the terminal 112 is provided only on the tip end part of the pattern antenna 111. In this fourth embodiment, a terminal is provided at both a tip end part and a root part (or base end part) of the passive elements.

Figure 11:
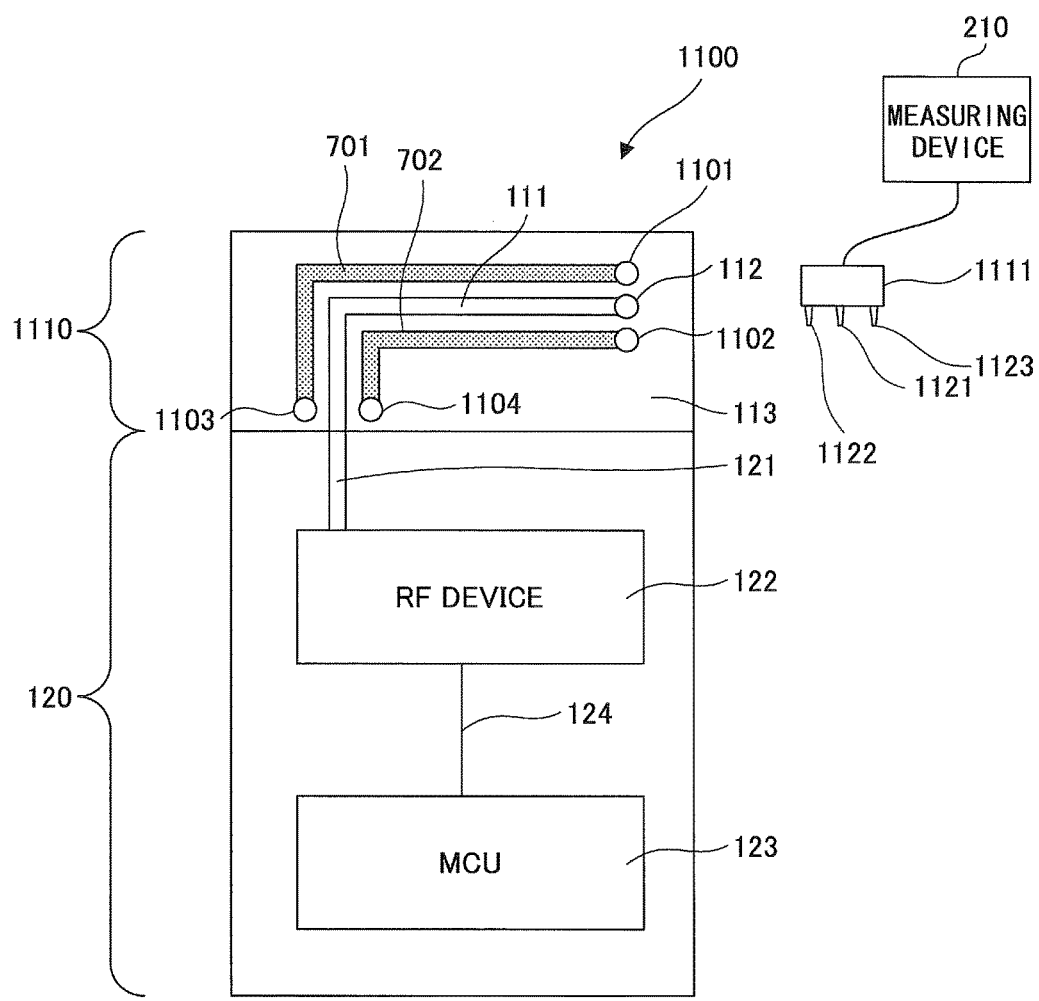
FIG. 11 is a diagram illustrating a configuration of the wireless module in a fourth embodiment.

FIG. 11 is a diagram illustrating a configuration of a wireless module 1100 in the fourth embodiment. Parts of the wireless module 1100 that are substantially the same as those corresponding parts of the wireless module 700 described in the second embodiment are designated by the same reference numerals, and a description thereof will be omitted.

In the wireless module 1100 illustrated in FIG. 11, terminals 1101 and 1102 are provided on tip end parts of the passive elements 701 and 702, respectively. In addition, terminals 1103 and 1104 are provided on root parts of the passive elements 701 and 702, respectively. Hence, in a case in which a probe 1111 of the measuring device 210 includes a measuring terminal 1121 and grounding terminals 1122 and 1123, the measuring terminal 1121 is electrically connected to the terminal 112 of the pattern antenna 111, and the grounding terminals 1122 and 1123 are electrically connected to the terminals 1101 and 1102 of the passive elements 701 and 702, respectively, when measuring the RF characteristics of the wireless module 1100.

The RF characteristics can be measured more stably when the grounding terminals 1122 and 1123 of the probe 1111 make electrical contact with the corresponding passive elements 701 and 702 at a plurality of points, compared to a case in which the electrical contact is made only at one point. The grounding terminals 1122 and 1123 preferably make contact with the terminals 1103 and 1104 of the passive elements 701 and 702, respectively, using a jig for making the electrical connection, in addition to making electrical contact with the terminals 1101 and 1102 of the passive elements 701 and 702, respectively.

With respect to the passive element 701, one of the terminal 1101 at the tip end part and the terminal 1103 at the root part may be provided, or both the terminals 1101 and 1103 may be provided. Alternatively, three or more terminals, including the terminals 1101 and 1103, may be provided on the passive element 701. The terminals of the passive element 702 may be provided in a manner similar to that of the passive element 701.

Fifth Embodiment

In the fourth embodiment described above, the terminal 112 is provided on the tip end part of the pattern antenna 111 for making electrical contact with the measuring terminal 1121 of the probe 1111. In addition, the terminals are provided on at least one of the tip end part and the root part of each of the passive elements 701 and 702 for making electrical contact with the respective grounding terminals 1122 and 1123 of the probe 1111.

However, the terminals provided in the antenna device are not limited to the terminals for making electrical contact with the measuring terminal 1121 and the grounding terminals 1122 and 1123 of the probe 1111. For example, the terminals provided on the tip end parts of the pattern antenna 111 and the passive elements 701 and 702 may have a land shape (or land pattern) which can electrically connect the wireless module and a circuit board on which the wireless module is mounted.

FIGS. 12A and 12B are diagrams illustrating a configuration of a wireless module 1200 in a fifth embodiment. FIG. 12A illustrates a top view of the wireless module 1200, and FIG. 12B illustrates a bottom view of the wireless module 1200. FIG. 12A also illustrates a circuit board 1220 on which the wireless module 1200 is mounted, and the measuring device 210 is illustrated on the top right of FIG. 12A. Parts of the wireless module 1200 that are substantially the same as those corresponding parts of the wireless module 1100 described in the fourth embodiment are designated by the same reference numerals, and a description thereof will be omitted.

In the wireless module 1200 illustrated in FIGS. 12A and 12B, a land shaped terminal 1201 is provided on a tip end of the pattern antenna 111. In addition, land-shaped terminals 1202 and 1203 are provided on tip ends of the passive elements 701 and 702, and terminals 1204 and 1205 are provided on roots of the passive elements 701 and 702.

The terminal 1201 electrically connects to the measuring terminal 1121 of the probe 1111 when measuring the RF characteristics of the wireless module 1200, and also electrically connects to a terminal provided on the circuit board 1220 when the wireless module 1200 is mounted on the circuit board 1220. The terminals 1202 and 1203 electrically connect to the grounding terminals 1122 and 1123 of the probe 1111, respectively, when measuring the RF characteristics of the wireless module 1200. The terminals 1202 and 1203 also electrically connect to terminals provided on the circuit board 1220, respectively, when the wireless module 1200 is mounted on the circuit board 1220. In addition, the terminals 1204 and 1205 electrically connect to the grounding terminals 1122 and 1123 of the probe 1111, respectively, when measuring the RF characteristics of the wireless module 1200. The terminals 1204 and 1205 also electrically connect to terminals provided on the circuit board 1220, respectively, when the wireless module 1200 is mounted on the circuit board 1220.

In a case in which the wireless module 1200 is mounted on the circuit board 1220 that is provided with an extension antenna 1221, the extension antenna 1221 is electrically connected to the pattern antenna 111 via the terminal 1201. In addition, extension passive elements 1222 and 1223 provided on the circuit board 1220 are electrically connected to the passive elements 701 and 702, respectively, via the respective terminals 1202 and 1203.

In other words, in the wireless module 1200 illustrated in FIGS. 12A and 12B, it is possible to extend the coplanar line formed in the antenna device 1210. This extension of the coplanar line is effective in a case in which the size of the antenna device 1210 is reduced and it is difficult to obtain the desired resonance frequency due to difficulty in securing sufficient lengths for the pattern antenna 111 and the passive elements 701 and 702. By forming an electronic module by mounting the wireless module 1200 on the circuit board 1220, it becomes possible to extend the coplanar line and obtain the desired resonance frequency.

Sixth Embodiment

In the second embodiment described above, the passive elements 701 and 702 are arranged along the pattern antenna 111, so that the tip end of the pattern antenna 111 and the tip ends of the passive elements 701 and 702 are arranged on the same straight line. On the other hand, in a sixth embodiment, the lengths of the pattern antenna and the passive elements are determined so that the tip end of the pattern antenna and the tip ends of the passive elements are arranged at mutually offset positions. By determining the lengths of the pattern antenna and the passive elements in this manner, it becomes possible to shift the resonance frequency of the pattern antenna towards the low-frequency side or the high-frequency side.

Figure 13:
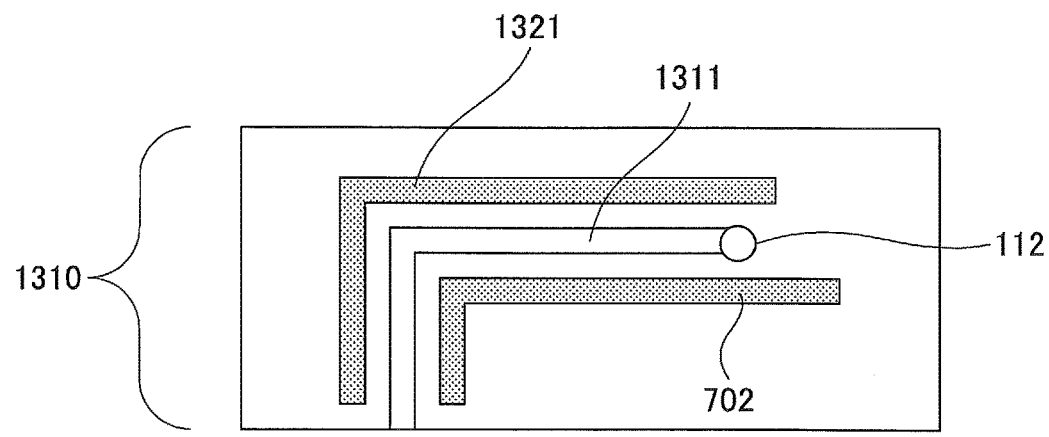
FIG. 13 is a diagram illustrating a configuration of the antenna device of the wireless module in a sixth embodiment.

FIG. 13 is a diagram illustrating an antenna device 1310 of the wireless module in the sixth embodiment. Parts of the antenna device 1310 that are substantially the same as those corresponding parts of the antenna device 710 of the wireless module 700 described in the second embodiment in conjunction with FIGS. 7A and 7B are designated by the same reference numerals, and a description thereof will be omitted.

In the antenna device 1310 illustrated in FIG. 13, a pattern antenna 1311 is determined to be shorter than the pattern antenna 111 of the antenna device 710 illustrated in FIG. 7A, and a passive element 1321 is determined to be shorter than the passive element 701 illustrated in FIG. 7A. By adjusting the lengths of the pattern antenna 1311 and the passive element 1321 in this manner, it becomes possible to adjust the resonance frequency of the pattern antenna 1311.

Seventh Embodiment

In the sixth embodiment described above, the lengths of the pattern antenna and the passive element are adjusted in order to modify the resonance frequency of the pattern antenna. On the other hand, in a seventh embodiment, the resonance frequency of the pattern antenna is modified by varying the shape of the passive element.

Figure 14:
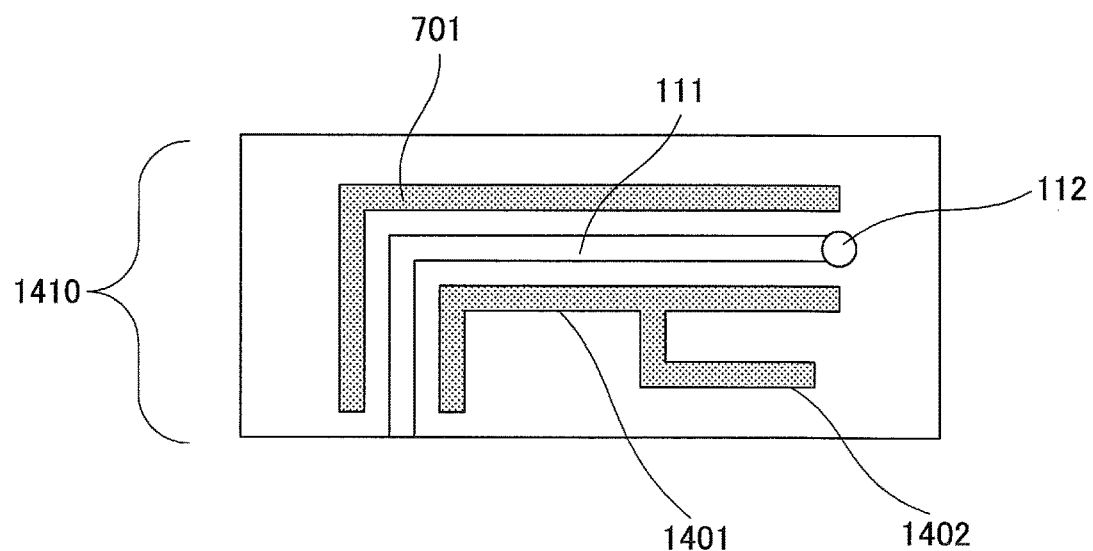
FIG. 14 is a diagram illustrating a configuration of the antenna device of the wireless module in a seventh embodiment.

FIG. 14 is a diagram illustrating an antenna device 1410 of the wireless module in the seventh embodiment. Parts of the antenna device 1410 that are substantially the same as those corresponding parts of the antenna device 710 of the wireless module 700 described in the second embodiment in conjunction with FIGS. 7A and 7B are designated by the same reference numerals, and a description thereof will be omitted.

In the antenna device 1410 illustrated in FIG. 14, a passive element 1402 branches from a passive element 1401. By providing the passive element 1402 that branches from the passive element 1401, it becomes possible to adjust the resonance frequency of the antenna device 1410.

Eighth Embodiment

In the second through seventh embodiments described above, only one pattern antenna is provided. On the other hand, in an eighth embodiment, a plurality of pattern antennas are provided, and one of the plurality of pattern antennas is used by switching the plurality of pattern antennas by a switch.

Figure 15A:
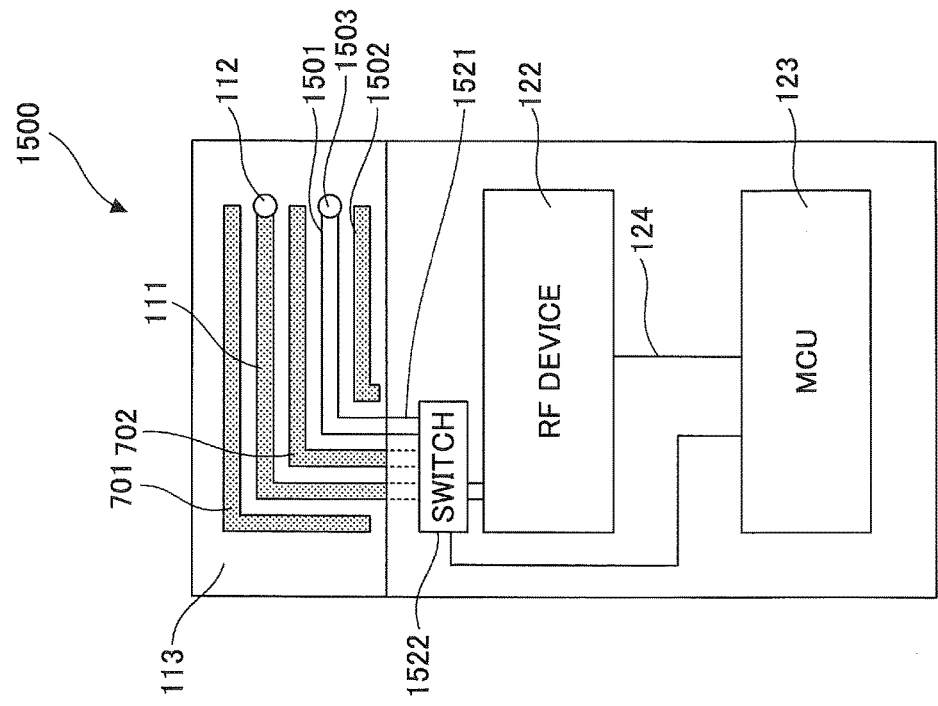
FIGS. 15A and 15B are diagrams illustrating, the wireless module in an eighth embodiment.
Figure 15B:
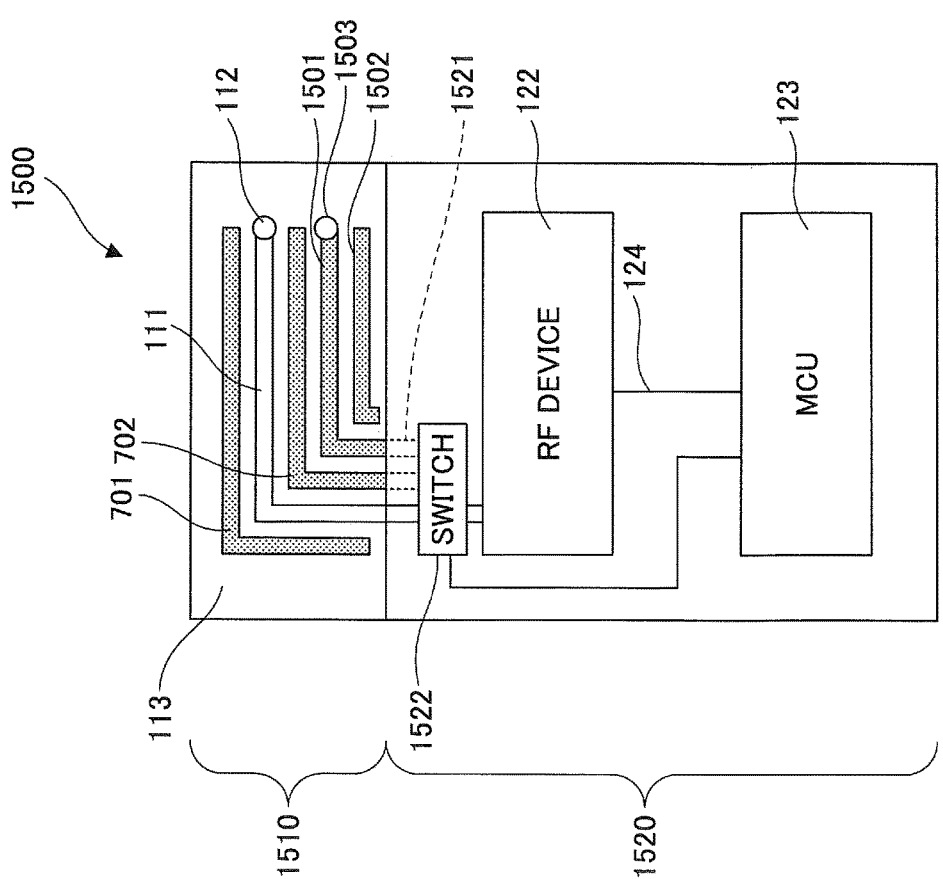

FIGS. 15A and 15B are diagrams illustrating a wireless module 1500 in the eighth embodiment. Parts of the wireless module 1500 that are substantially the same as those corresponding parts of the wireless module 700 described in the second embodiment in conjunction with FIGS. 7A and 7B are designated by the same reference numerals, and a description thereof will be omitted.

In the wireless module 1500 illustrated in FIGS. 15A and 15B, an antenna device 1510 includes a pattern antenna 1501, a terminal 1503, and a passive element 1502 in addition to the pattern antenna 111, the terminal 112, and the passive elements 701 and 702. In addition, a radio device 1520 includes a switch 1522. Three transmission lines 1521 are formed between the antenna device 1510 and the radio device 1520.

In this example, the pattern antenna 1501 has a resonance frequency different from that of the pattern antenna 111. For example, the pattern antenna 111 has a resonance frequency of 2 [GHz], while the pattern antenna 1501 has a resonance frequency of 5 [GHz].

The switch 1522 connects to one of the three transmission lines 1521 based on an instruction received from the MCU 123. FIG. 15A illustrates an example in which the switch 1522 connects to one of the transmission lines 1521 that transmits a signal to the pattern antenna 111 having the resonance frequency of 2 [GHz]. On the other hand, FIG. 15B illustrates an example in which the switch 1522 connects to another one of the transmission lines 1521 that transmits a signal to the pattern antenna 1501 having the resonance frequency of 5 [GHz].

FIG. 15A illustrates a state in which the switch 1522 connects to one of the transmission lines 1521 that transmits the signal to the pattern antenna 111, and FIG. 15B illustrates a state in which the switch 1522 connects to another one of the transmission lines 1521 that transmits the signal to the pattern antenna 1501. However, the switch 1522 may be connected to a transmission line that transmits a signal to the passive element 702 that is arranged between the pattern antennas 111 and 1501. In this case, the passive element 702 that is arranged between the pattern antennas 111 and 1501 can function as the pattern antenna and the pattern antennas 111 and 1501 on the other hand function as passive elements.

Accordingly, by providing a plurality of patterns in the antenna device 1510 and switching the transmission line by the switch 1522 to one of the transmission lines that transmits the signal to one of the patterns that is to function as the pattern antenna, it becomes possible to provide the wireless module 1500 that can cope with a plurality of resonance frequencies.

Figure 16:
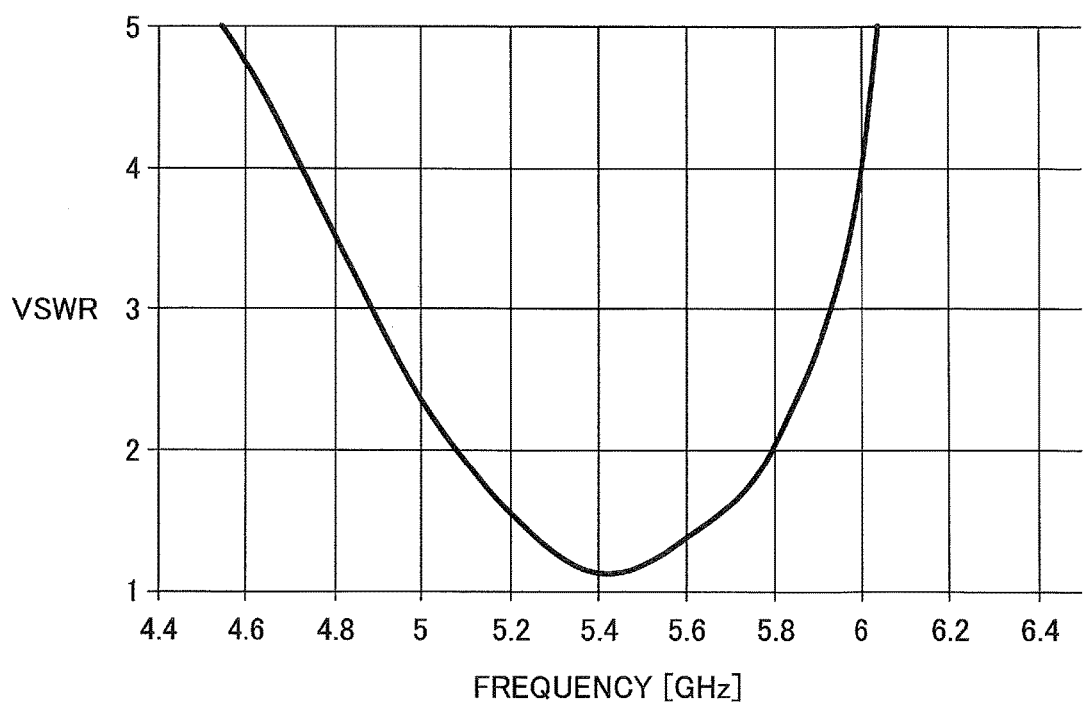
FIG. 16 is a diagram illustrating a voltage standing wave ratio of a case in which a connecting destination of a switch is switched.

FIG. 16 is a diagram illustrating a VSWR of a case in which a connecting destination of the switch 1522 is switched to the pattern antenna 1501. In the case in which the connecting destination of the switch 1522 is switched to one of the transmission lines 1521 that transmits the signal to the pattern antenna 1501, the VSWR can be suppressed to approximately 1.2 in a frequency band of 5.2 [GHz] to 5.6 [GHz]. In other words, the resonance frequency in this first case becomes 5.2 [GHz] to 5.6 [GHz]. The VSWR for a case in which the connecting destination of the switch 1522 is switched to another one of the transmission lines 1521 that transmits the signal to the pattern antenna 111 becomes the same as the VSWR illustrated in FIG. 6.

Ninth Embodiment

In the eighth embodiment described above, a plurality of inverted L-shaped pattern antennas are arranged with the same orientation. On the other hand, in a ninth embodiment, the plurality of inverted L-shaped pattern antennas are arranged with different orientations.

Figure 17:
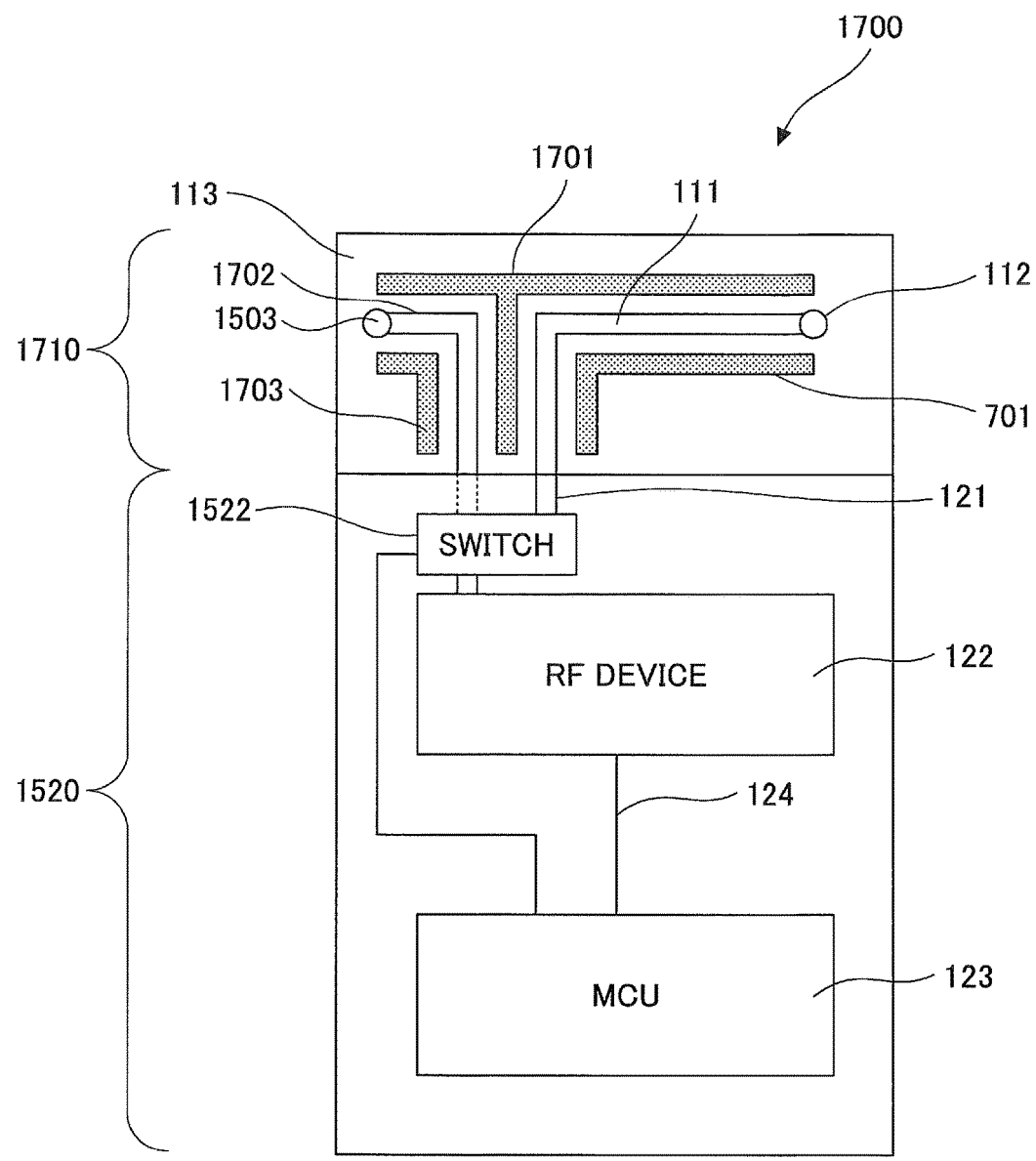
FIG. 17 is a diagram illustrating a configuration of the wireless module in a ninth embodiment.

FIG. 17 is a diagram illustrating a configuration of a wireless module 1700 in the ninth embodiment. Parts of the wireless module 1700 that are substantially the same as those corresponding parts of the wireless module 1500 described in the eighth embodiment in conjunction with FIGS. 15A and 15B are designated by the same reference numerals, and a description thereof will be omitted.

In the wireless module 1700 illustrated in FIG. 17, a pattern antenna 1702 is arranged with an orientation different from that of the pattern antenna 111, and a passive element 1703 is arranged with the same orientation as the pattern antenna 1702. In addition, a passive element 1701 is provided as a passive element that is common to the pattern antennas 111 and 1702.

Similarly as in the case of the eighth embodiment described above, the pattern antenna 1702 and the pattern antenna 111 have mutually different resonance frequencies. For example, the pattern antenna 111 has a resonance frequency of 2 [GHz], and the pattern antenna 1702 has a resonance frequency of 5 [GHz].

The RF characteristics of the pattern antenna 1702 improves when compared to the RF characteristics of the pattern antenna 1502 illustrated in FIGS. 15A and 15B. This is because, in the case of the pattern antenna 1702, the length along a vertical direction in FIG. 17 can be made longer than the length of the pattern antenna 1501 along the vertical direction in FIGS. 15A and 15B.

Tenth Embodiment

In each of the embodiments described above, the wireless module is not limited to a particular usage. In a tenth embodiment, the wireless module may be applied to a television set, a specified low-power radio, a wireless LAN (Local Area Network), BLUETOOTH (Registered Trademark), an antenna, or the like.

According to each of the embodiments described above, it is possible to reduce the cost and the size of the wireless module.

The description above uses terms such as "determine", or the like to describe the embodiments, however, such terms are abstractions of the actual operations that are performed. Hence, the actual operations that correspond to such terms may vary depending on the implementation, as is obvious to those skilled in the art.

Although the embodiments are numbered with, for example, "first," "second," "third," "fourth," "fifth," "sixth," "seventh," "eighth," "ninth," or "tenth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wireless module comprising:
   a substrate made of a dielectric and having a first surface, and a second surface opposite to the first surface;
   a first antenna device including a pattern antenna provided on the first surface of the substrate, and a first terminal provided on a tip end part of the pattern antenna;
   a circuit, provided on the first surface of the substrate, and configured to transmit and receive signals through the first antenna device; and
   a transmission line, provided on the first surface of the substrate, and configured to electrically connect the first antenna device and the circuit,
   wherein a ground plane is eliminated from a periphery of the first antenna device,
   wherein, in a state in which the wireless module is placed on an external ground plane which is separate from the wireless module to measure frequency characteristics of the wireless module by a measuring device, the second surface of the substrate contacts the external ground plane, and the first antenna device opposes the external ground plane via the substrate, and
   wherein the first antenna device is formed so that a characteristic impedance of the pattern antenna in the state in which the wireless module is placed on the external ground plane matches a characteristic impedance of the transmission line and a characteristic impedance of the measuring device.

2. The wireless module as claimed in claim 1, wherein the pattern antenna is configured to form the transmission line having a predetermined characteristic impedance in the state in which the wireless module is placed on the external ground plane.

3. The wireless module as claimed in claim 2, wherein the signals output from the circuit are input to the measuring device through the first terminal and a probe of the measuring device electrically connecting to the first terminal, in a state in which the second surface of the substrate contacts the external ground plane.

4. The wireless module as claimed in claim 2, wherein dimensions of the first antenna device and a thickness of the substrate are determined so that the pattern antenna forms the transmission line having the predetermined characteristic impedance.

5. The wireless module as claimed in claim 2, further comprising:
   a plurality of passive elements provided on the first surface of the substrate along both sides of the pattern antenna,
   wherein the first antenna device forms coplanar lines having the predetermined characteristic impedance, in a state in which the second surface of the substrate contacts the external ground plane.

6. The wireless module as claimed in claim 5, wherein the plurality of passive elements include a second terminal.

7. The wireless module as claimed in claim 1, further comprising:
   at least one second antenna device, other than the first antenna device, provided on the first surface of the substrate; and
   a switch configured to electrically connect one of the first and second antenna devices to the circuit.

8. The wireless module as claimed in claim 7, wherein a ground plane is eliminated from a periphery of the second antenna device.

9. The wireless module as claimed in claim 1, wherein a width of the antenna and a thickness of the substrate are smaller than a wavelength of the signals output from the circuit, to form a microstrip transmission line in the state in which the wireless module is placed on the external ground plane.

10. The wireless module as claimed in claim 1, wherein, in a plan view taken along a direction perpendicular to the first surface of the substrate, the substrate occupies an area smaller than an area of the external ground plane.

11. The wireless module as claimed in claim 1, further comprising:
   a pair of passive elements provided on the first surface of the substrate along both sides of the pattern antenna; and a pair of second terminals coupled to the pair of passive elements, wherein the first antenna device faints coplanar lines having a predetermined characteristic impedance, in a state in which the second surface of the substrate contacts the external ground plane, and wherein the first terminal is contacted by a measuring terminal of a probe of the measuring device and the pair of second terminals are contacted by a pair of grounding terminals of the probe of the measuring device when the measuring device measures the frequency characteristics of the wireless module.

12. An electronic module comprising:
a wireless module comprising:
a substrate made of a dielectric and having a first surface, and a second surface opposite to the first surface,
a first antenna provided on the first surface of the substrate, and including a first terminal provided on a tip end part of the first antenna,
a circuit, provided on the first surface of the substrate, and configured to transmit and receive signals through the first antenna,
a transmission line, provided on the first surface of the substrate, and configured to electrically connect the first antenna and the circuit, and
a plurality of passive elements provided on the first surface of the substrate along both sides of the first antenna,
wherein, in a state in which the wireless module is set on a ground plane which is separate from the wireless module to measure frequency characteristics of the wireless module, the second surface of the substrate contacts the ground plane, the first antenna opposes the ground plane via the substrate, and a characteristic impedance of the first antenna matches a characteristic impedance of the transmission line,
wherein the first antenna is configured to form the transmission line having a predetermined characteristic impedance in the state in which the wireless module is set on the ground plane, and the first antenna forms coplanar lines having the predetermined characteristic impedance, in a state in which the second surface of the substrate contacts the ground plane; and
a circuit board on which the wireless module is mounted, wherein the circuit board includes
an extension antenna electrically connected to the first terminal of the first antenna, and
a plurality of extension passive elements provided along both sides of the extension antenna, and electrically connected to a second terminal of the plurality of passive elements.

13. The electronic module as claimed in claim 12, wherein a width of the antenna and a thickness of the substrate are smaller than a wavelength of the signals output from the circuit, to foam a microstrip transmission line in a state in which the second surface of the substrate contacts the ground plane.

14. The electronic module as claimed in claim 12, wherein the plurality of passive elements of the wireless module include a pair of passive elements, provided on the first surface of the substrate, and arranged along respective sides of the antenna for an entire length of the antenna.

15. A measuring method to measure frequency characteristics of a wireless module, comprising:
setting, on a ground plane, the wireless module that includes a substrate, an antenna provided on the substrate and having a terminal provided on a tip end part thereof, a circuit that transmits and receives signals through the antenna, and a transmission line provided on the substrate and electrically connecting the antenna and the circuit; and
in a state in which the wireless module is set on the ground plane and a characteristic impedance of the antenna matches a characteristic impedance of the transmission line, electrically connecting a probe of a measuring device to the terminal and causing the antenna to function as the transmission line to disable the antenna when measuring the frequency characteristics of the wireless module by the measuring device.

16. The measuring method as claimed in claim 15, wherein, in the state in which the wireless module is set on the ground plane, the characteristic impedance of the antenna matches a characteristic impedance of the measuring device.

17. The measuring method as claimed in claim 15, further comprising:
absorbing the signals output from the circuit via the disabled antenna of the wireless module by a resistance load of the measuring device, to thereby suppress effects of radio emission from the antenna and reduce a signal loss caused by an impedance mismatch between the antenna and the measuring device.

18. The measuring method as claimed in claim 15, wherein, in the state in which the wireless module is set on the ground plane, an impedance between the transmission line and the antenna matches an impedance between the antenna and the measuring device.

19. The measuring method as claimed in claim 15, wherein, in a plan view taken along a direction perpendicular to a surface of the substrate provided with the antenna, the circuit, and the transmission line, the ground plane overlaps an entire area of the substrate.

20. A wireless module comprising:
a substrate having a first surface, and a second surface opposite to the first surface;
a first antenna provided on the first surface of the substrate;
a circuit, provided on the first surface of the substrate, and configured to transmit and receive signals through the first antenna;
a transmission line, provided on the first surface of the substrate, and configured to electrically connect the first antenna and the circuit; and
a pair of passive elements, provided on the first surface of the substrate, and arranged along respective sides of the antenna for an entire length of the antenna,
wherein the first antenna includes a first terminal provided on a tip end part thereof, and
wherein, in a state in which the wireless module is set on a ground plane which is separate from the wireless module, the first antenna opposes the ground plane via the substrate, and a characteristic impedance of the first antenna matches a characteristic impedance of the transmission line.

* * * * *